US006426656B1

United States Patent
Dally et al.

(10) Patent No.: US 6,426,656 B1
(45) Date of Patent: Jul. 30, 2002

(54) HIGH SPEED, LOW-POWER INTER-CHIP TRANSMISSION SYSTEM

(75) Inventors: William J. Dally, Stanford; Daniel K. Hartman, San Jose, both of CA (US)

(73) Assignee: Velio Communications, Inc., San Jose, CA (US)

( * ) Notice: Subject to any disclaimer, the term of this patent is extended or adjusted under 35 U.S.C. 154(b) by 0 days.

(21) Appl. No.: 09/625,650

(22) Filed: Jul. 26, 2000

Related U.S. Application Data

(60) Provisional application No. 60/198,188, filed on Apr. 19, 2000.

(51) Int. Cl.[7] ............................ G01R 19/00; G11C 7/00
(52) U.S. Cl. ......................................... 327/51; 365/203
(58) Field of Search ................................. 327/112, 309, 327/321, 51, 52, 56, 57, 89, 560–566; 365/203–208

(56) References Cited

U.S. PATENT DOCUMENTS

| | | | | |
|---|---|---|---|---|
| 4,914,429 A | | 4/1990 | Upp | ..................... 340/825.8 |
| 5,828,622 A | * | 10/1998 | McClure | ............... 365/230.03 |
| 5,856,752 A | * | 1/1999 | Arnold | ..................... 327/112 |
| 6,005,438 A | * | 12/1999 | Shing | ..................... 330/253 |
| 6,204,697 B1 | * | 3/2001 | Zerbe | ..................... 326/98 |
| 6,272,577 B1 | * | 8/2001 | Leung et al. | ................. 326/21 |

OTHER PUBLICATIONS

Shin, Hyun J. and Hodges, David A., "A 250–Mbit/s CMOS Crosspoint Switch," IEEE Journal of Solid–State Circuits, vol. 24, No. 2, Apr. 1989, pp. 478–486.

Dally, William J. and Poulton, John W., "Digital Systems Engineering," Cambridge University Press, 1998, pp. 385–387.

* cited by examiner

Primary Examiner—My-Trang Nuton
(74) Attorney, Agent, or Firm—Hamilton, Brook, Smith & Reynolds, P.C.

(57) ABSTRACT

In an integrated circuit, a data link relies on low swing differential signals. A push-pull driver circuit and a receiver circuit are both clocked from a common on-chip clock. A driver circuit includes an H-bridge of NMOS transistors and a line-to-line precharge circuit which reduces the power requirements of the circuit. A clocked repeater within the link may itself comprise a clocked receiver and an H-bridge driver with line-to-line precharge.

60 Claims, 16 Drawing Sheets

HIGH SPEED, LOW-POWER INTER-CHIP TRANSMISSION SYSTEM

RELATED APPLICATION(S)

This application claims the benefit of U.S. Provisional Application No. 60/198,188, filed Apr. 19, 2000, the entire teachings of which are incorporated herein by reference.

BACKGROUND OF THE INVENTION

In telecommunications switches and other digital systems, considerable delay and power is also consumed moving high-bandwidth signals across chips. In conventional CMOS chips, such signals are driven at CMOS levels where the two power supplies are used to represent logic "1" and logic "0". Consider moving a high-bandwidth STS-192 (10 Gb/s) signal across a long on-chip bus where the supply voltage is 1.8V and each signal line has 1 pF of capacitance. Using conventional CMOS signaling, not only is such system very slow, due to the large RC time constant of the long wire, but it also dissipates over 30 mW of power just transporting the signal.

Some prior art systems, such as that presented in Dally and Poulton, *Digital Systems Engineering*, Cambridge University Press, 1998, pp. 385–387, reduces the delay and power dissipation of on-chip signaling paths by employing differential signaling with a low-voltage swing using a precharged signaling arrangement. However, while such systems reduce power by lowering the voltage swing, they also consume additional power to precharge the lines each cycle. Also, this precharge operation limits the maximum rate at which the lines can operate.

SUMMARY OF THE INVENTION

In accordance with one aspect of the invention, a data link on an integrated circuit comprises a push-pull driver circuit, clocked from a clock, driving a pair of differential lines, one line driven high while the other line is pulled low. A receiver includes a sense amplifier clocked from the same clock.

Each line may be driven through a low swing with the driver circuit clocked through a timing circuit. The timing circuit includes a delay, the timing of which varies in a manner similar to timing variations in the driver circuit. Line-to-line coupling of the differential lines allows precharge of the lines without drawing precharge power.

The driver circuit may be an NMOS H-bridge. Both the driver and receiver may be formed of MOSFETs.

In accordance with another aspect of the invention, the on-chip transmission system includes a regenerative repeater, clocked from the clock, to regenerate the signal from the driver circuit. The repeater includes a sense amplifier, the output of which may enable the driver circuit of the repeater.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

One aspect of the present invention is an on-chip link circuit that moves a digital signal from one point on a chip to another, usually several mm away. The link circuit of the present invention uses a push-pull driver, preferably an H-bridge of NFETs and line-to-line precharge to achieve substantial speed and power advantages compared to prior-art link circuits.

Figure 1:
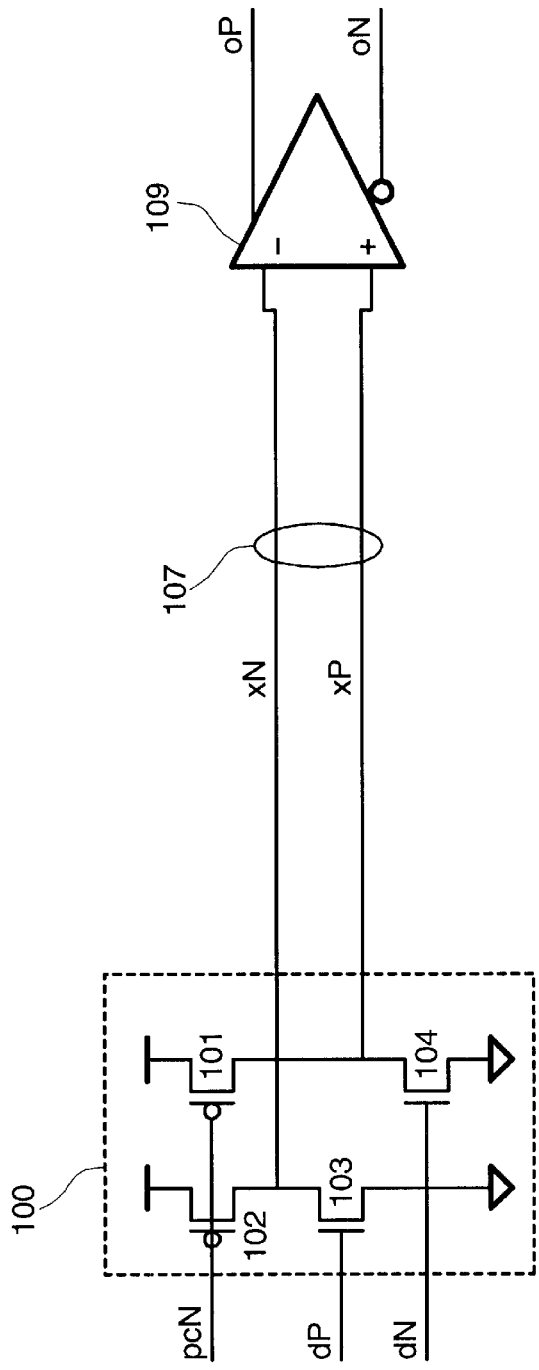
FIG. 1 illustrates a prior high-speed on-chip link circuit using low swing differential signaling.
Figure 2:
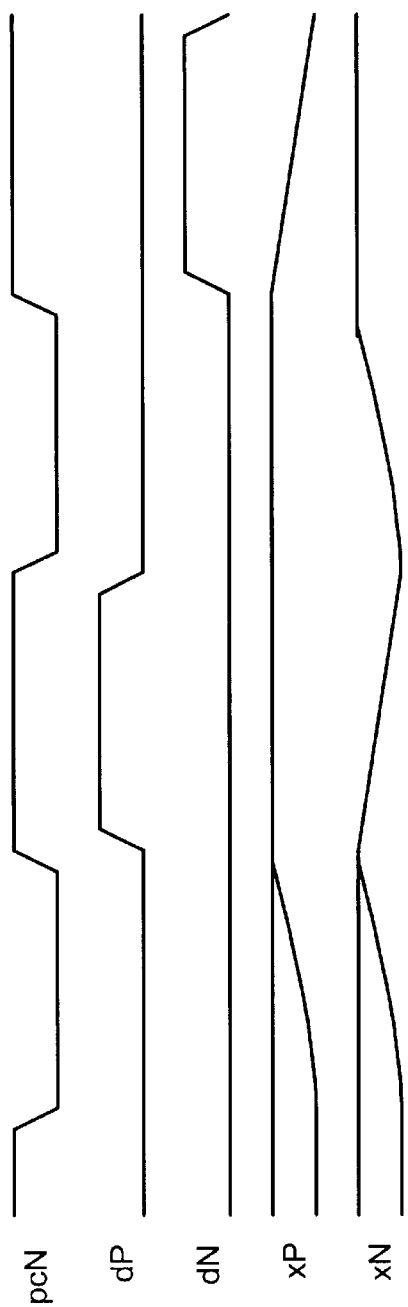
FIG. 2 illustrates the signals of FIG. 1.

A prior high-speed on-chip link circuit (of the type described in Dally and Poulton, Digital Systems Engineering, pp. 385–387) is illustrated in FIG. 1 and waveforms for this prior-art circuit are shown in FIG. 2. This circuit reduces the delay and power dissipation of on-chip signaling paths by employing differential signaling with a low-voltage swing using a precharged signaling arrangement. However, while such systems reduce power by lowering the voltage swing, they also consume additional power to precharge the lines each cycle. Also, this precharge operation limits the maximum rate at which the lines can operate.

The driver circuit for this link, 100, consists of a pair of PFET precharge devices, 101 and 102, and a pair of NFET open-drain drivers, 103 and 104. The precharge devices and drivers are coupled to a differential on-chip line 107 that may be many mm in length and thus have significant capacitance. An amplifier 109 senses the difference in voltage between the two conductors of the differential line 107. Each of the transistors 101–104 forms a leg of an H-bridge.

Timing for this prior circuit is shown in FIG. 2. As is typical of precharged circuits, operation of the circuit alternates between precharge intervals, during which both conductors are driven to a common state, and data intervals, during which one conductor is driven to a different state. First, the link conductors xP and xN, 107, are precharged by PFETs 101 and 102 when signal pcN is asserted low. Then to send a binary "1" over the link, pcN is deasserted and signal dP is asserted. This causes conductor xN to discharge by a small amount (typically by 100–300 mV). Amplifier 109 senses that V(xP)>V(xN) (where V(xP) is the voltage on conductor xP) and thus signals a "1". After sending a "1" the link is again precharged by deasserting dP and asserting pcN. Once precharge is complete, another bit may be sent over the link. In FIG. 2, a binary "0" is sent after the second precharge by deasserting pcN to stop the precharge and asserting dN to discharge conductor xP by a small amount. The sense voltage, the amount by which xN and xP must differ to reliably send a bit is set by the noise environment and the offset voltage of receiver 109. Values between 100 mV and 300 mV are typical.

The prior circuit of FIG. 1 is significantly more efficient than using full-swing CMOS logic. However, it leaves considerable room for improvement because of the way it precharges one of the two conductors to a supply rail before discharging one of the conductors through the full sense voltage. For a constant current limit, the present invention essentially doubles the speed and halves the power of the prior art circuit by driving both conductors in opposite directions during the data intervals and precharging to mid-swing by shorting the two conductors together during the precharge intervals. Speed is doubled because each conductor needs to swing only half as far during each interval (half of the sense voltage). With constant current I and constant capacitance C, halving the voltage swing $\Delta V$ cuts the time t required in half since charge $Q=C\Delta V=It$. Power is halved as well since the precharge is accomplished by charge sharing between the two lines and thus takes no charge from the power supply. In the prior art circuit, one of the two conductors is charged from the power supply over the full sense voltage each cycle. With the present invention, one of the two conductors is charged from the power supply through half of the sense voltage each cycle. This takes exactly half the charge, and hence half the power, as the prior art circuit.

Figure 3:
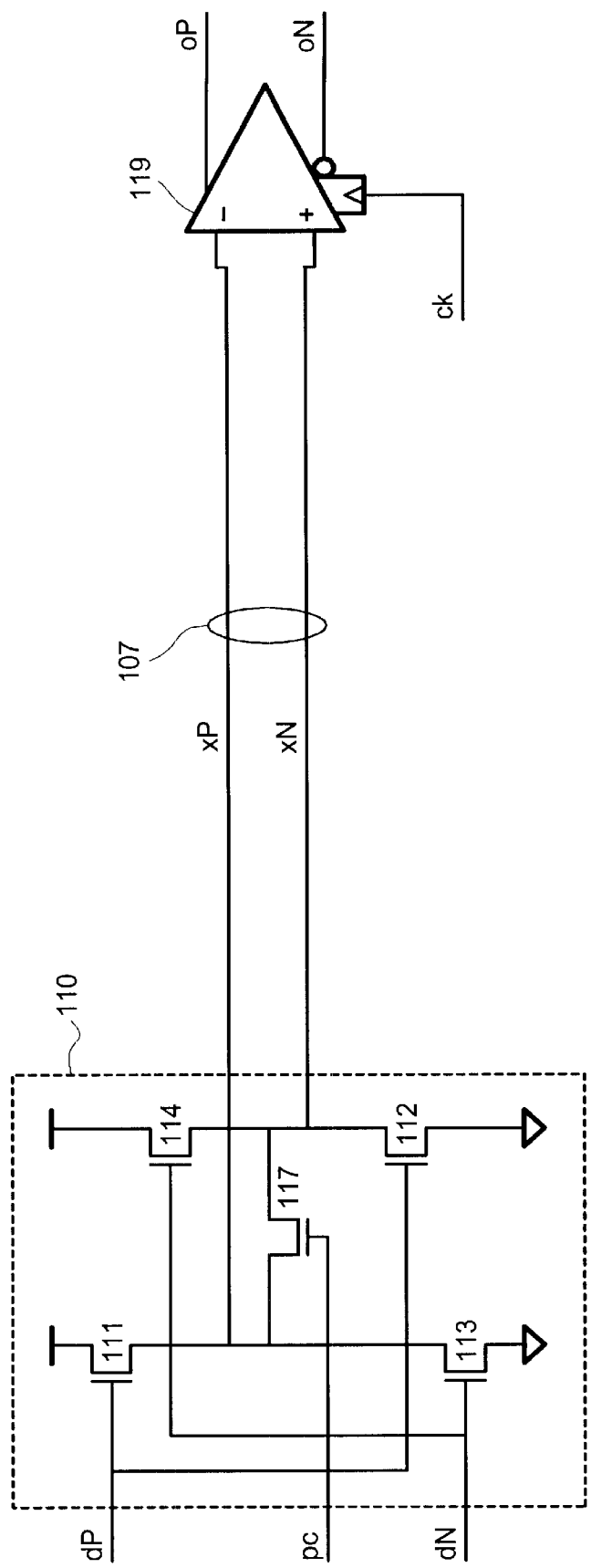
FIG. 3 is an electrical schematic of an improved high speed data link in accordance with the present invention.
Figure 6:
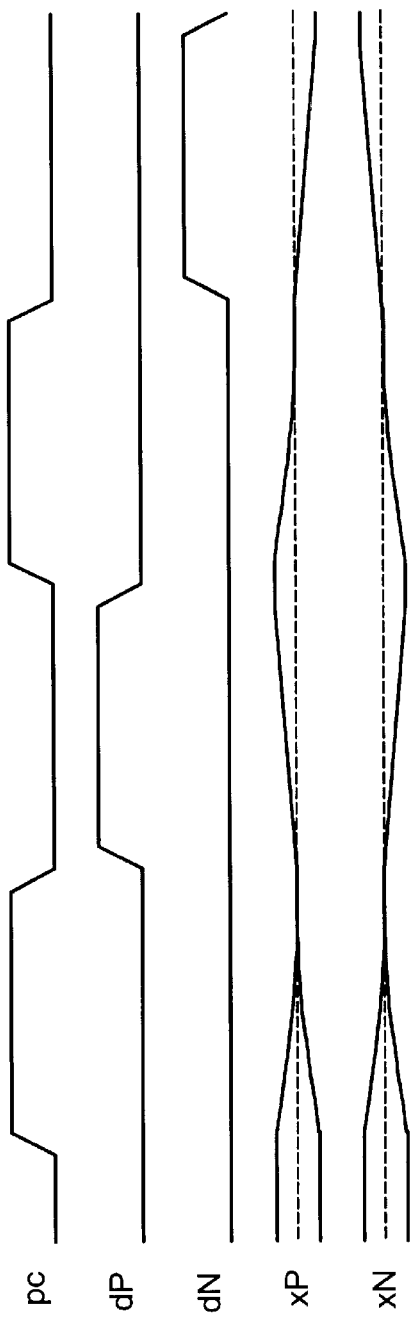
FIG. 6 illustrates waveforms of signals in the circuit of FIG. 3.

The improved circuit of the present invention is illustrated in FIG. 3. In this circuit, the differential line 107 is driven by an NFET H-bridge driver with shorting precharge 110. Operation of this circuit is illustrated in the waveforms of FIG. 6. During precharge intervals, signal pc is asserted high turning on shorting NFET 117. This FET shorts the two conductors of line 107 together, sharing charge between them. Both conductors wind up at the midpoint of the voltage swing. The high conductor drops by passing charge to the low conductor which in turn rises. Thus, at the end of the precharge interval, both conductors of line 107 are at a common voltage. Also, no charge is transferred from the power supply to achieve this precharge.

During each data interval, rather than driving just one line as in the prior art circuit, both lines of conductor 107 are driven, one high and one low, in a push-pull action. To send a "1" over the link, as illustrated in the first data interval of FIG. 6, dP is asserted which turns on NFETs 111 and 112. Conductor xP is driven high by NFET 111 and conductor xN is driven low by NFET 112. Because both lines are driven, each line need only be driven through half of the sense voltage. For example, if the sense voltage were 200 mV, each line would only be driven through 100 mV. The charge transferred from the power supply to the high-going line each data cycle is $C\Delta V/2$ (where $\Delta V$ is the sense voltage) as compared to $C\Delta V$ in the prior art circuit.

After the full sense voltage is developed across the conductors of line 107, receive amplifier 119 is clocked to sense and amplify this voltage. A clocked amplifier requires less power than a continuous time amplifier and rejects noise by looking only at the wide portion of the eye of the differential signal. The line is then precharged by deasserting dP and reasserting pc to short the two conductors together again.

During the second data interval shown in FIG. 6, a "0" is sent across the line by deasserting pc to terminate the precharge and asserting dN which turns on FETs 113 and 114. Conductor xP is pulled low by FET 113 and conductor xN is driven high by FET 114. Again, because both conductors are driven, each conductor need only swing through half of the sense voltage to develop the full sense voltage across the pair of conductors.

Because of the charge-sharing precharge, the circuit settles to a common-mode voltage that gives equal swings on the high-going line and the low-going line. The common-mode voltage is typically near the negative power supply. For example, for one process, using equal sized pull-up and pull-down devices in driver 110, a voltage supply of 1.8 volts and a 200 mV sense voltage, the common mode voltage was 250 mV. The sense voltage is the difference in voltage between the line in the high state and the line in the low state, and is equal to the swing of a line from low state to high state. Thus, in this example, the low swing of each line is 0.2 volts compared to a full swing of 1.8 volts or one-ninth of full swing. Low swing is certainly less than one half of a full swing and is usually less than one quarter of full swing.

Figure 4:
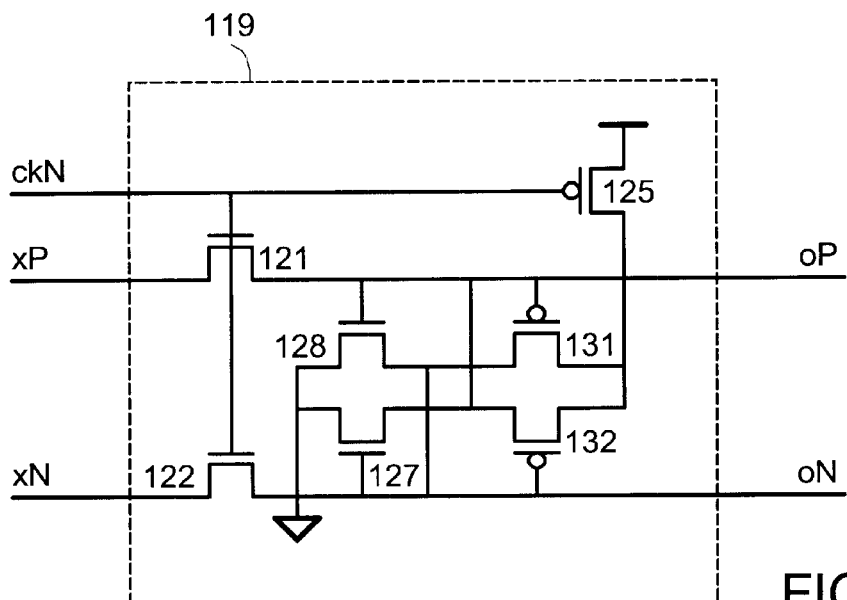
FIG. 4 illustrates a clocked receiver for use in the circuit of FIG. 3.
Figure 5:
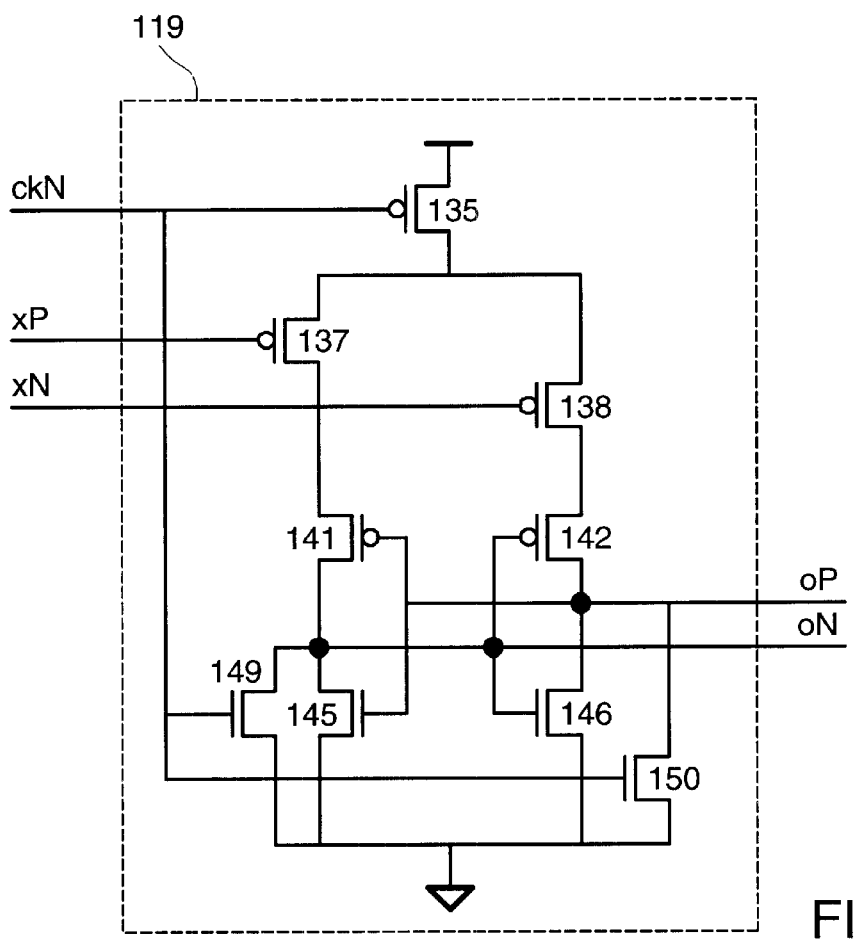
FIG. 5 illustrates an alternative clocked receiver for use in the circuit of FIG. 3.

Two embodiments of the clocked receiver 119 of FIG. 3 are illustrated in FIGS. 4 and 5. FIG. 4 illustrates a receiver that couples the line 107 to the sense nodes of the amplifier via a pair of pass transistors 121 and 122. FIG. 5 shows a gate-isolated sense amplifier. Both of these amplifiers have the property that one output is asserted (high) when the clock is asserted (low) and both outputs are deasserted (low) when the clock is deasserted (high).

For the pass-transistor-isolated amplifier, the outputs follow the inputs through pass transistors 121, 122 when the clock is high. Typically, a latch circuit follows the amplifier and the swing of the oP and oN signals is insufficient to activate the latch. Being below the required logic levels, the signal looks like a logic 0 to the last circuit. However, when the circuit is clocked by a low clock signal ckN, the pass transistors 121 and 122 turn off to capture the signal on lines oP and oN, and transistor 125 turns on to energize the latch circuit of transistors 127, 128, 131 and 132. Assume that the signal on line oP is higher than the signal on line oN. The signal on line oP tends to turn transistor 131 off and to turn transistor 128 on, and the signal on line oN tends to turn the transistor 132 on and transistor 127 off. The current through transistor 132 drives oP higher to fully turn on transistor 128 and turn off transistor 131. With transistor 128 fully on, signal oN is pulled to ground, fully turning off transistor 127 and turning on transistor 132. As a result, the partial swing received on lines xP and xN is sensed and driven through a full swing on lines oP and oN when the clock is asserted (low).

For the gate isolated amplifier of FIG. 5, the outputs are predischarged to GND when the clock is high through transistors 149 and 150. When ckN is asserted low, transistors 149 and 150 are turned off and voltage is applied through transistor 135 to the sense amplifier. Assume that xP is higher than xN in the received partial swing differential signal. Transistor 137 tends to turn off as transistor 138 tends to turn on. With both gates and sources of transistors 141 and 142 at ground, transistor 142 begins to conduct. With charge building on oP, transistor 141 is driven fully off and transistor 145 is driven fully on to pull signal oN full low. Signal oN similarly drives transistor 142 fully on and transistor 146 fully off to drive output oP to the supply voltage level. Thus the partial swing on signals xP and xN is sensed to a full swing differential signal on lines oP and oN.

Both the pass-gate input amplifier of FIG. 4 and the gate isolated amplifier of FIG. 5 are examples of regenerative amplifiers in that, when enabled by a clock, they derive their gain by using positive feedback to reinforce a small signal. In both amplifiers there is originally a small signal 0.2V or less across output nodes oP and oN. This signal is amplified by the positive feedback of a pair of back-to-back inverters. In FIG. 4 the inverters are formed by transistors 127, 128, 131, and 132. In FIG. 5 transistors 141, 145, 142, and 146 form the inverters. In either case, once the inverters are enabled, they increase the magnitude of the voltage across the output nodes oP and oN exponentially, increasing the voltage by a factor of e (2.718) each time constant until oP and oN reach the power rails. A typical regenerative amplifier in an 0.18 $\mu$m CMOS process has a time constant of about 100 ps, so a regeneration time of just 1 ns gives a gain of $e^{10}$, over 22,000.

The circuit of FIG. 5 is the sense amplifier which is now used. Both of the amplifier configurations of FIGS. 4 and 5 are well known and many other sense amplifier configurations could be used.

An on-chip wire is fundamentally an RC transmission line and hence has a delay that increases quadratically with length, since both R and C increase linearly with length. For this reasons, it is advantageous to break long on-chip lines into multiple segments separated by repeaters. In the prior art such repeaters are most often realized as CMOS inverters that require a full-swing input and produce a full-swing output. Such full-swing CMOS repeaters suffer the same power and delay disadvantages as full-swing drivers and receivers.

Figure 7:
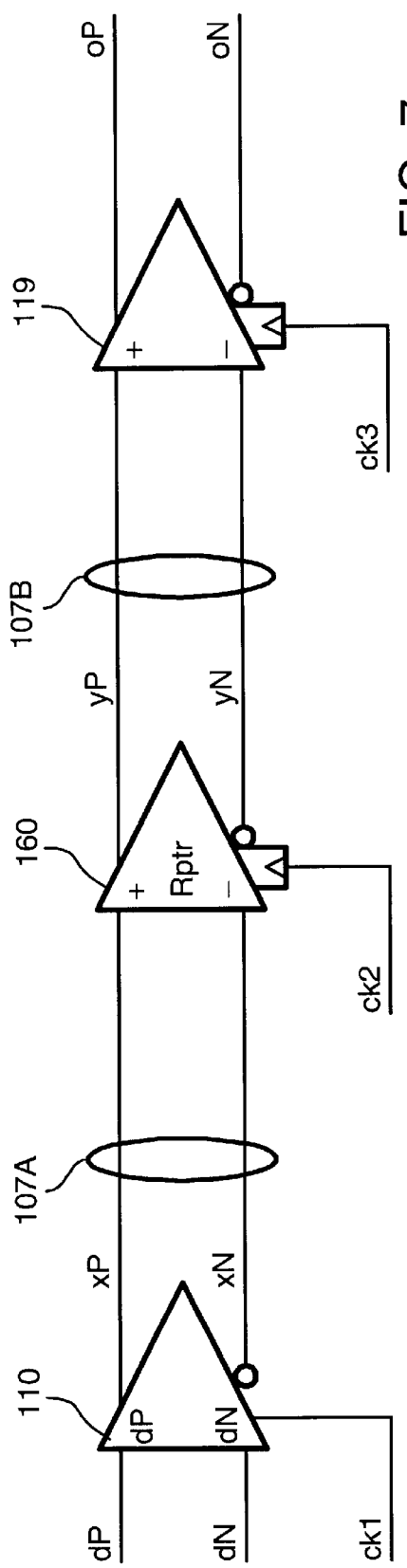
FIG. 7 illustrates an on-chip data link including a repeater circuit.

The present invention can be used to realize an on-chip transmission line with one or more repeaters as illustrated in FIG. 7 for the case of a single repeater. The line 107 is broken into two segments, 107A and 107B. During each data interval, as signaled by ck1 being asserted, driver 110 drives the current bit onto line segment 107A in exactly the manner described in relation to FIGS. 3 and 6. After line 107A reaches the sense voltage, ck2 is asserted. This triggers repeater 160 to sense the voltage on segment 107A, determine whether the current bit is a "1" or a "0", and repeat this bit by driving segment 107B. After segment 107B is driven to the sense voltage, ck3 is asserted which triggers amplifier 119 to sense the voltage on this segment and generate the output for the entire line.

Because this transmission line is on chip, the clock supplied to the driver 110, received 119 and repeater 160 can be precisely timed relative to each other from a common clock for both low power and high speed operation. Each circuit is clocked by one of plural clock signals, having different phases, which are provided by the common clock. Prior off-chip repeater circuits which recover the clock from the signal and regenerate the signal using that clock have lacked the advantage of the use of a precise on-chip clock.

Figure 8:
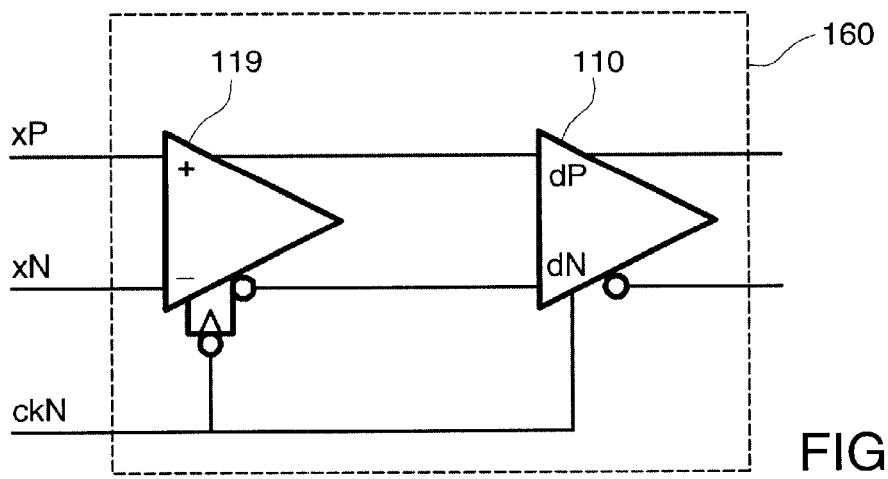
FIG. 8 is a block diagram of the repeater circuit of FIG. 7.
Figure 9:
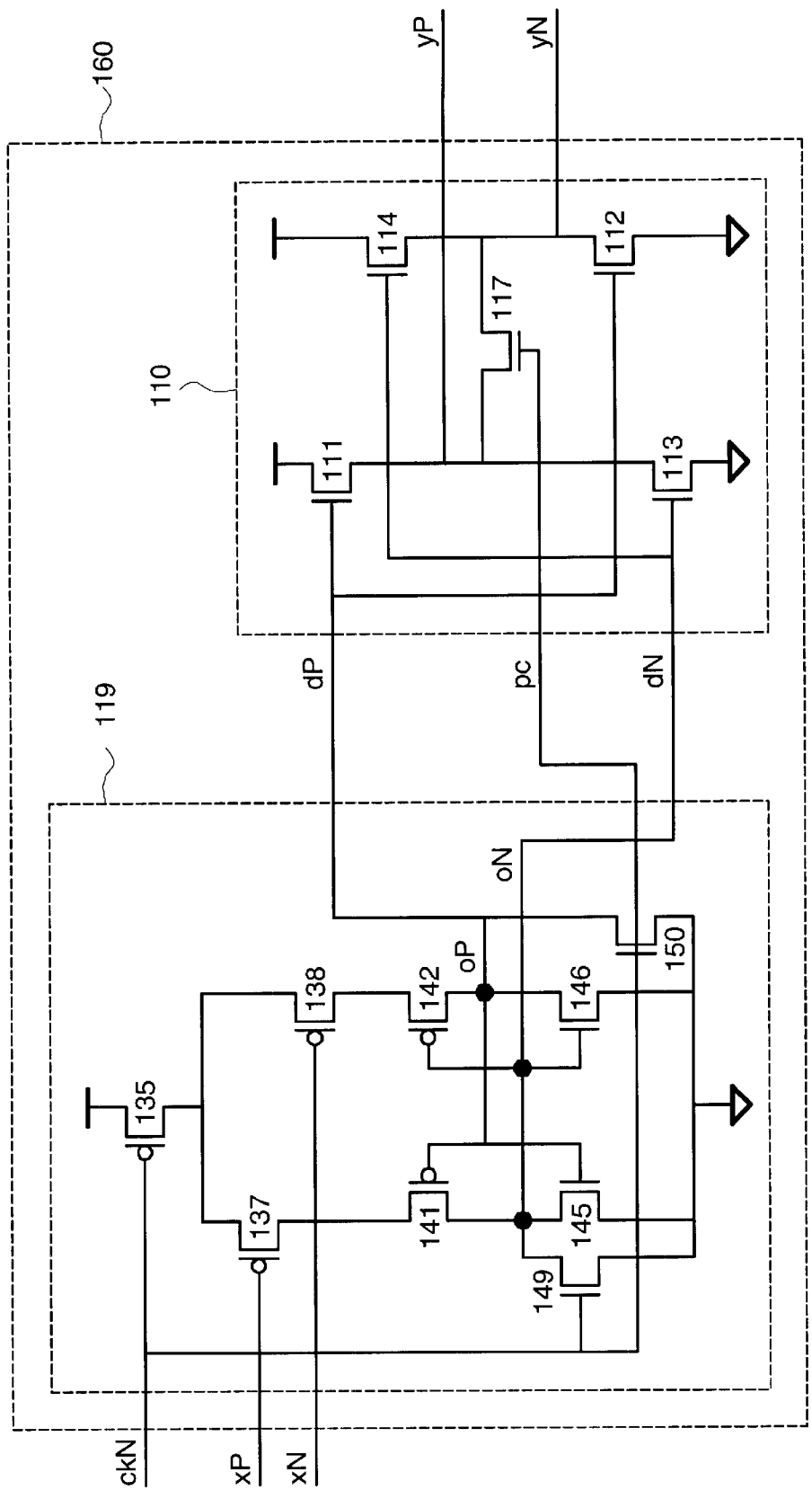
FIG. 9 is a detailed electrical schematic of the repeater circuit of FIG. 8.

Repeater 160 combines the functionality of receive amplifier 119 and driver 110. In fact, as illustrated in FIGS. 8 and 9, repeater 160 can be realized by combining a receive amplifier 119 and a driver 110 back to back. Because the outputs of receive amplifier 119 are deasserted when the clock is inactive (high), these signals can be used directly to drive the dP and dN inputs of driver 110. When the clock is asserted, the receive amplifier drives the correct driver input. When the clock is deasserted (high), the both driver inputs dP and dN are deasserted and the driver is precharged by connecting its precharge input to the clock.

The width of the dP and dN pulses into driver 110 determines the voltage swing on line 107 (or segments 107A and 107B). To ensure that the voltage swing is large enough to be reliably sensed but not so large as to dissipate excess power, the preferred embodiment uses a self-timing circuit to control the width of the pulses.

Figure 10:
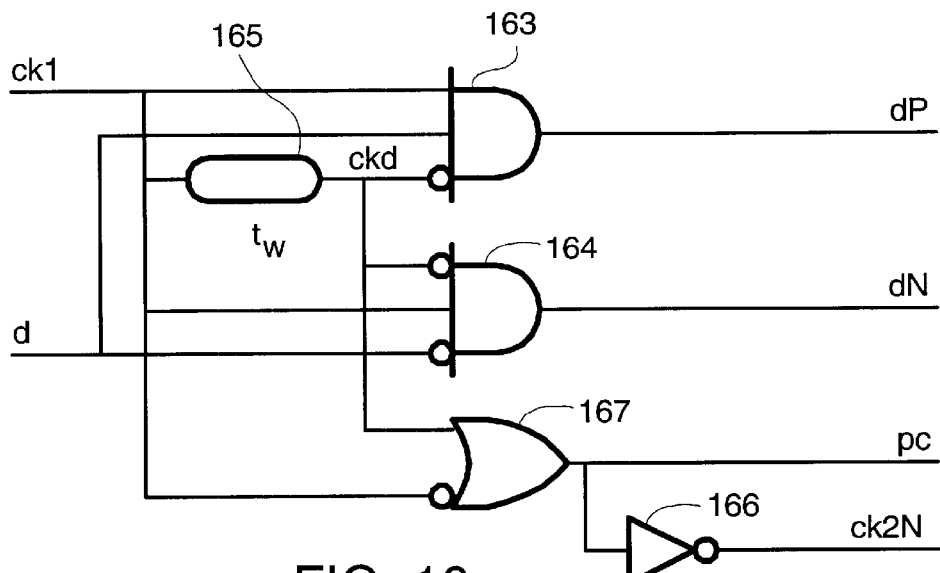
FIG. 10 illustrates a self-timing circuit for generating the input signals to the driver of FIG. 3.
Figure 11:
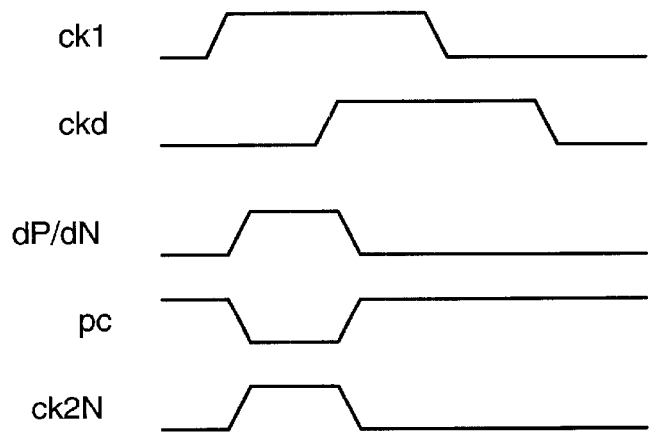
FIG. 11 illustrates waveforms of signals in FIG. 10.

A self-timing circuit for controlling the width of the driver input pulses is illustrated in FIG. 10 and waveforms for this circuit are shown in FIG. 11. When input clock ck1 is asserted, the clock enables AND gates 163 and 164 to assert either dP or dN depending on the state of input d. After a delay of tw, signal ckd, the output of delay line 165 is asserted disabling both dP and dN. Thus, the pulse generated on dP or dN will have a width of tw. The ckd signal also causes the precharge, pc, signal to be asserted via OR gate 167. This causes driver 110 to be precharged whenever a data input is not asserted. An inverted version of the precharge signal, ck2N, generated by inverter 166, can be used to clock receiver 119 or repeater 160.

Preferably, delay line 165 is designed so that its delay tracks process, voltage, and temperature variations in the same manner as driver 110 so that while variation of these parameters will cause pulse width variation, the voltage swing on line 107 will remain constant across process voltage and temperature. A faster driver, for example, will charge to a higher voltage over a given pulse duration, but a faster delay circuit which tracks the speed of the driver will offset the speed of the driver with a shorter pulse duration. This tracking can be accomplished using methods well known in the art. For example, delay line 165 can be realized from an even number of inverters with each inverter pair loaded by a wire load fabricated on the same layer as line 107. With appropriate ratios of devices, the delay of this line will closely track the delay of driver 110 driving line 107.

Because the circuit of the present invention is capable of very high speed, in some applications it is advantageous to drive data on both edges of the clock signal. Such 'double-data-rate' operation can be accomplished using the self-timing circuit shown in FIG. 12. The operation of this circuit is best understood by referring to the waveforms shown in FIG. 13. As with the circuit of FIG. 10, delay line 165 with delay tw controls the pulse width of the asserted data signals. Unlike FIG. 10, however, the circuit of FIG. 11 asserts data signals on both edges of the clock. AND-OR gates 171 and 172 multiplex data inputs d1 and d0 to provide data from d1 when ck1 is high and ckd is low, and d0 when ck1 is low and ckd is high. Data is provided by asserting output dP high if the selected data input is true (high) or asserting dN high if the selected data input is false (low). When ck1 and ckd are in the same state, high or low, both dP and dN are low and the precharge signal, pc, is asserted.

When sending bits on both edges of the clock over line 107, the inverted version of the pc signal, ck2N, can be used to clock the data through a repeater 160. Alternatively, data may be demultiplexed using a pair of receivers 119 by clocking one receiver on the rising edge of ckd (to recover d1) and clocking a second receiver on the falling edge of ckd (to recover d0).

Figure 14:
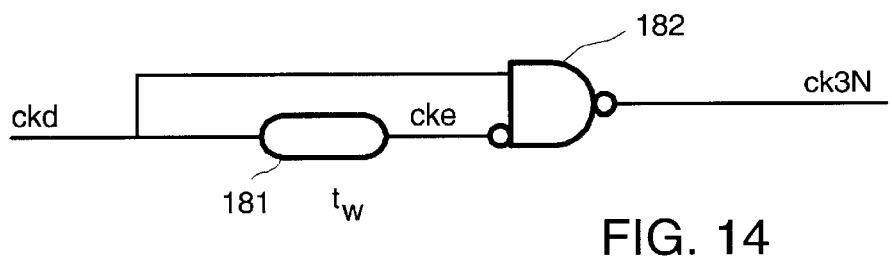
FIG. 14 illustrates a self-timing circuit for use in the repeater of FIG. 7.
Figure 15:
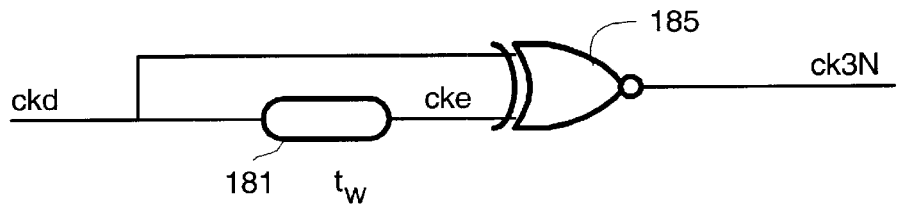
FIG. 15 illustrates a double-data-rate self timing circuit for use in the repeater of FIG. 7.

When a repeater is used as illustrated in FIG. 7, the pulse width of the driving signals internal to the repeater can be self-timed as well by using the circuit of FIG. 14 (for sending data on one edge of the clock), or FIG. 15 (for sending data on both edges of the clock). These circuits delay signal ckd by tw using delay line 181 to generate delayed clock signal cke. For the single-edged case (FIG. 14), NAND gate 182 asserts ck2N low, enabling repeater 160 to drive segment 107B, during the tw long period when ckd is high and cke is low. For the double-edged case (FIG. 15), XNOR gate 185 asserts ck2N low during both tw long periods when ckd and cke are in opposite states. When the repeater is used, a receive amplifier or a next-stage repeater can either be clocked on the rising edge of ck2N or, for the double-edge case, on both edges of cke.

One skilled in the art will understand that the logic gates in FIGS. 10, 12, 14, and 15 may be realized as static CMOS gate circuits or using other well-know circuit techniques such as domino logic or pass-transistor logic.

High-Performance, Low-Power Switch Core

A second aspect of the present invention adapts the low-power, high-speed signaling circuit described above to the design of a high-speed CMOS crossbar switch core. The advantages of a low swing data link are multiplied by the large quantity of links through the many crosspoints of a large crossbar switch. The large power requirements of full swing data links in a very large crossbar switch would run the risk of collapsing the power supply.

Figure 16:
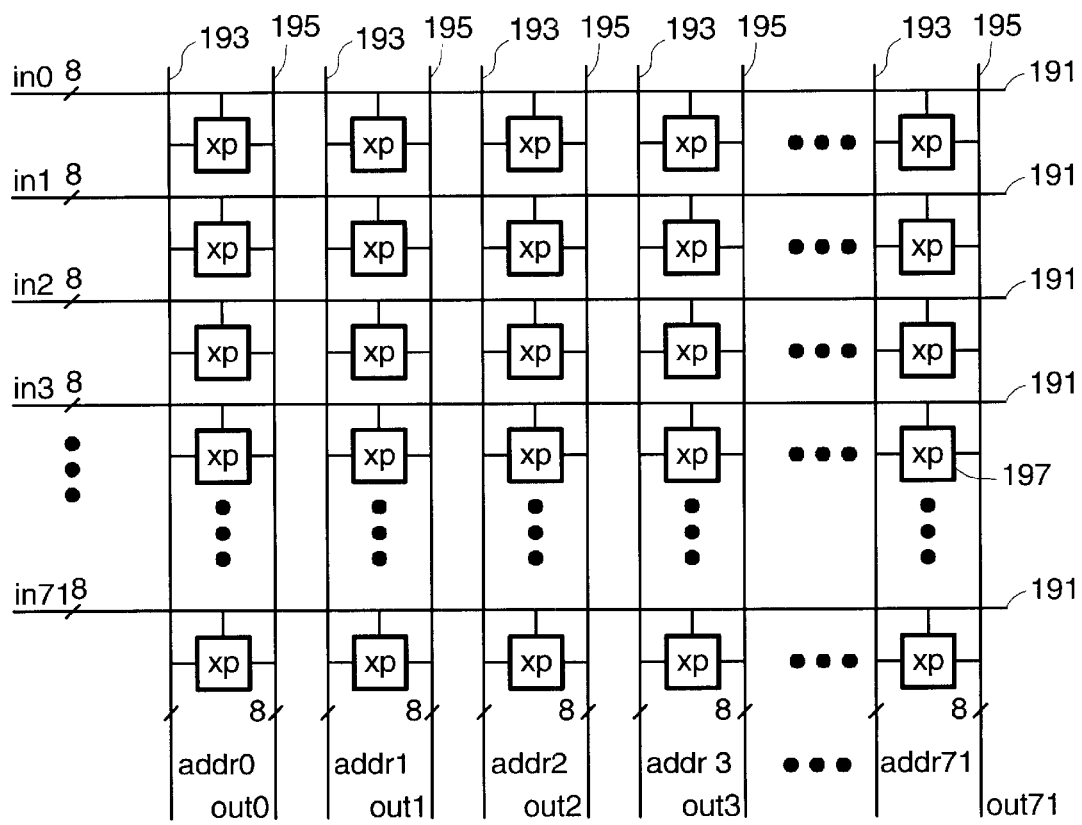
FIG. 16 illustrates the general organization of a crossbar switch.

FIG. 16 shows the general organization of a crossbar switch. The preferred embodiment of the present invention is a 72×72 synchronous CMOS crossbar switch that connects any of the 72 STS-96 (4.976 Gb/s) input channels to each STS-96 output channel and can be reconfigured on each byte. The switch operates at a data rate of 622 MHz and achieves STS-96 bandwidth by switching one byte (8 bits) of data during each data period. To simplify timing, the switch uses a 311 MHz clock and switches data on both edges of the clock. The aggregate input bandwidth of the switch is 358 Gb/s. The output bandwidth is the same for a total bandwidth (input plus output) of 716 Gb/s.

The crossbar switch includes 72 8-bit wide input buses 191, 72 output address select buses 193, and 72 8-bit wide output buses 195. Each input bus is connected to each output bus by an eight-bit wide crosspoint, xp 197. There are 5,184 byte-wide crosspoints 197 in the complete switch that are composed of 41,472 individual single-bit crosspoints.

The preferred embodiment is realized using differential signaling so each signal line in FIG. 16 uses two conductors, one to carry the positive rail and one to carry the negative rail of the differential signal. Thus the 72 8-bit wide input signals 191 comprise 576 signals carried on 1152 wires.

During each 1.6 ns data period, a byte of data is driven onto each of the 8-bit differential input buses 191. At the same time an address, selecting one of the 72 input buses, is encoded on each of the 72 address buses 193. Each address bus selects the input bus that is to be connected to the corresponding output bus by enabling the crosspoint 197 connected to that bus. At most one crosspoint in each column is enabled. In addition to point-to-point communications, the switch can be configured to perform an arbitrary multicast or broadcast operation by having multiple address buses 193 select the same input bus 191.

Each crosspoint that is enabled samples the data on the input bus it is connected to and drives this data on the output bus it is connected to in a manner identical to the repeater of FIGS. 8 and 9. The output data is then sampled off the output bus by a receiver (not shown). After the input buses are sampled, each of the 576 input bits are precharged to mid-swing by shorting the two rails of each bit together. The output buses are precharged in a similar manner after they are sampled.

Figure 17:
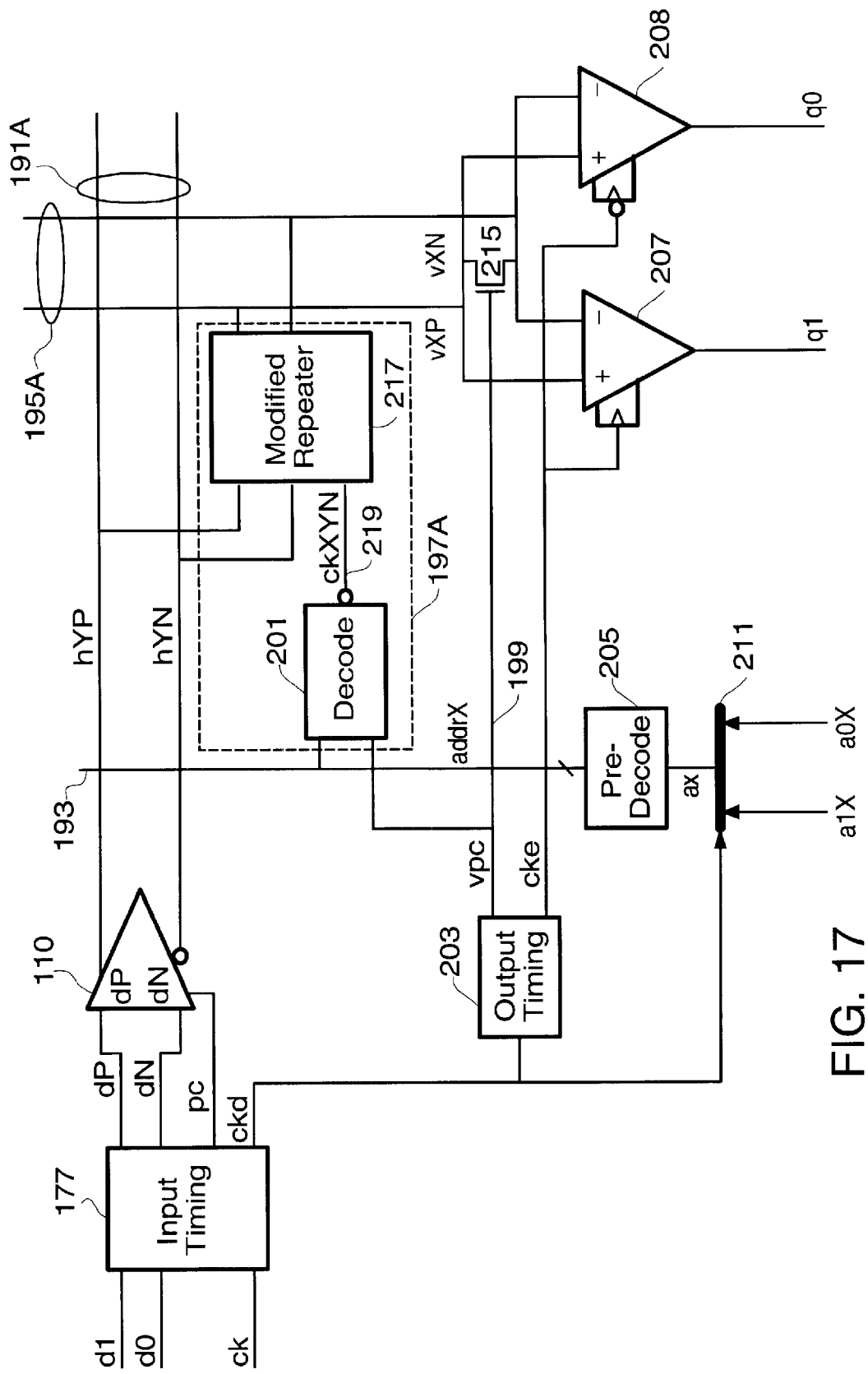
FIG. 17 illustrates details of one row and column bit slice of the crossbar switch of FIG. 16 in accordance with the present invention.

FIG. 17 shows additional details of one row and column bit slice of the crossbar switch core of FIG. 16. That is, the figure shows one bit 191A of one of the input buses 191 and one bit 195A of one of the output buses 195 along with all of the corresponding address bus 193. Signals in FIG. 17 associated with each row, such as input bit 191A are labeled with the Y-coordinate of the row; for example, the two rails of input bit 191 A are labeled hYP and hYN. Similarly, signals associated with each column are labeled with the X-coordinate of the column, such as addrX, vXP, and vXN. Signals associated with a crosspoint are labeled with both the X-coordinate of the column and the Y-coordinate of the row such as ckXYN. Thus, FIG. 17 depicts the circuitry associated with one bit of row Y and one bit of column X of the crossbar switch of FIG. 16. One skilled in the art will understand how to repeat the circuitry in this figure to populate the entire switch.

Figure 18:
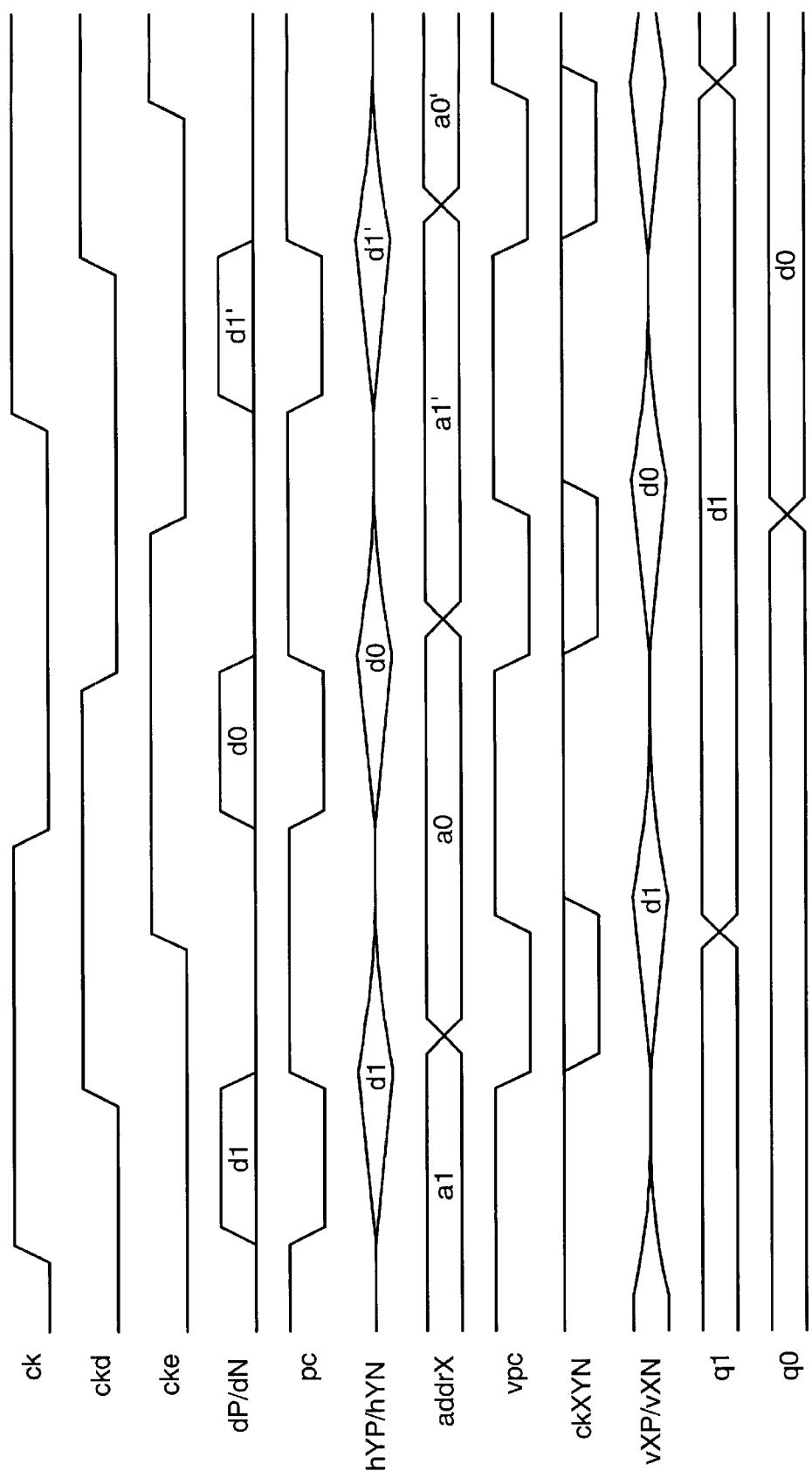
FIG. 18 illustrates waveforms of signals in the circuit of FIG. 17.
Figure 20:
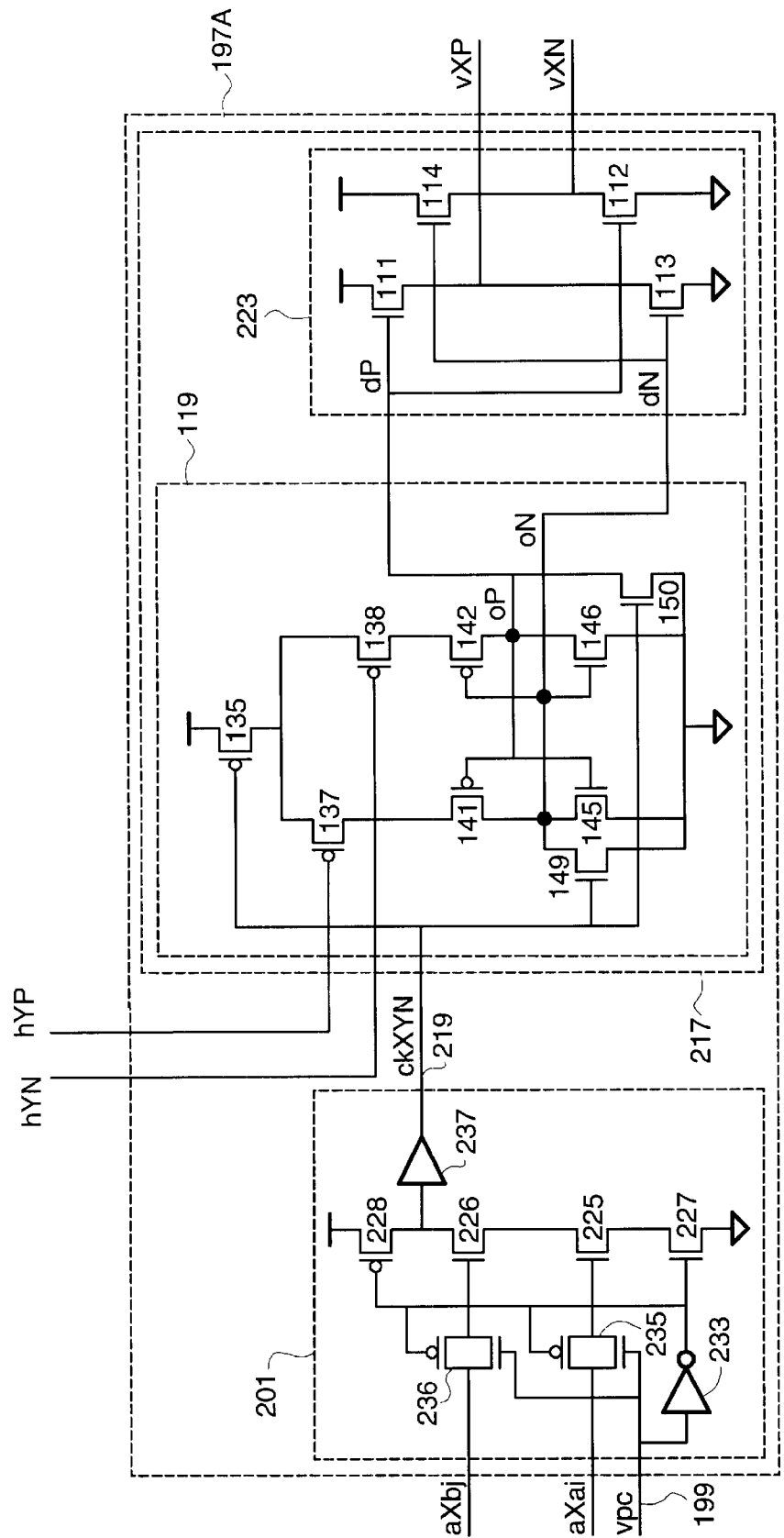
FIG. 20 is an electrical schematic of the decoder and repeater of FIG. 17.

The operation of the crossbar bit slice shown in FIG. 17 is best understood by referring to the waveforms shown in FIG. 18. Each time the input clock, ck, toggles, the double-data rate input timing circuit 177 asserts a drive signal dN or dP to drive the selected data bit, d1 on clock high and d0 on clock low, onto differential horizontal input line hYP, hYN 191A via driver 110. When the sense voltage has been developed across this line, the timing circuit 177 deasserts dN and dP and asserts precharge signal, pc, and toggles delayed clock, ckd. The precharge signal causes driver 110 to initiate precharge of the horizontal input line 191A by shorting the two polarities of this line together. Toggling delayed clock ckd causes the output timing circuit 203 to deassert the vertical precharge, vpc 199. Deasserting vpc serves both to disable precharge device 215 and to clock crosspoint decoder 201. When the vpc signal 199 is deasserted and the row address encoded on address bus addrX 193 matches the Y-coordinate of the current row, the crosspoint clock ckXYN 219 is asserted. Asserting crosspoint clock 219 causes the modified repeater 217 in the crosspoint to sample input line 191A and to drive column X vertical output line vXP,vXN 195A. Note that this sampling and drive only occurs in crosspoints that are selected by the predecoded address on addrX 193. Also, unselected crosspoints do not precharge the vertical line 195A because the repeater is modified from the circuit shown in FIG. 9 as shown in FIG. 20 to omit precharge transistor 117 from the driver 223. Instead this precharge is performed for the entire column by precharge device 215. Thus the crosspoint clock, ckXYN 219 serves both as a clock and as an output enable.

After the modified repeater 217 in selected crosspoint 197A has driven the vertical line vXP, vXN 195A through the sense voltage, output timing circuit 203 toggles delayed clock cke and asserts the vertical precharge, vpc 199. Toggling clock cke samples the bit on the vertical line 195A into one of the receive amplifiers 207 and 208. When cke goes high, the data is sampled into amplifier 207 to recover on signal q1 the signal clocked in on d1 of the selected input row when ck went high. Similarly, when cke goes low, the data on the vertical line 195A is sampled into amplifier 208 to recover on signal q0 the data clocked in on d0 of the selected input row when ck went low. Receivers 207 and 208 are identical in design to receiver 119 shown in FIG. 5 except that the clock to receiver 208 is inverted.

The crossbar is reconfigured each byte time, selecting a new input row to be connected to each output column under control of the address lines 193. Each cycle, two 7-bit addresses, a1X and a0X, are input to column X of the crossbar. Address a1X selects one of 72 input rows to be connected to output column X when the clock is high while a0X selects the input row to be selected when the clock is low. These two addresses are multiplexed by multiplexer 211 under control of delayed clock ckd. When ckd is low, a1X is selected and when ckd is high, a0X is selected. The output of the multiplexer is pre-decoded from a 7-bit binary format into an 8-bit one-hot plus a 9-bit one hot encoding. The resulting 17 lines are distributed up the column as addrX 193. The falling edge of vpc samples the relevant bits of addrX into the final decoder 201 associated with each crosspoint. This sampling occurs before addrX can change in response to ckd switching the multiplexer. Final decoder 201 samples one bit from the 8-bit address group and one bit from the 9-bit address group. If both sampled bits are high, the current crosspoint is selected and crosspoint clock ckXYN 219 is asserted to enable the modified repeater 217 to drive the vertical lines 195A.

Figure 12:
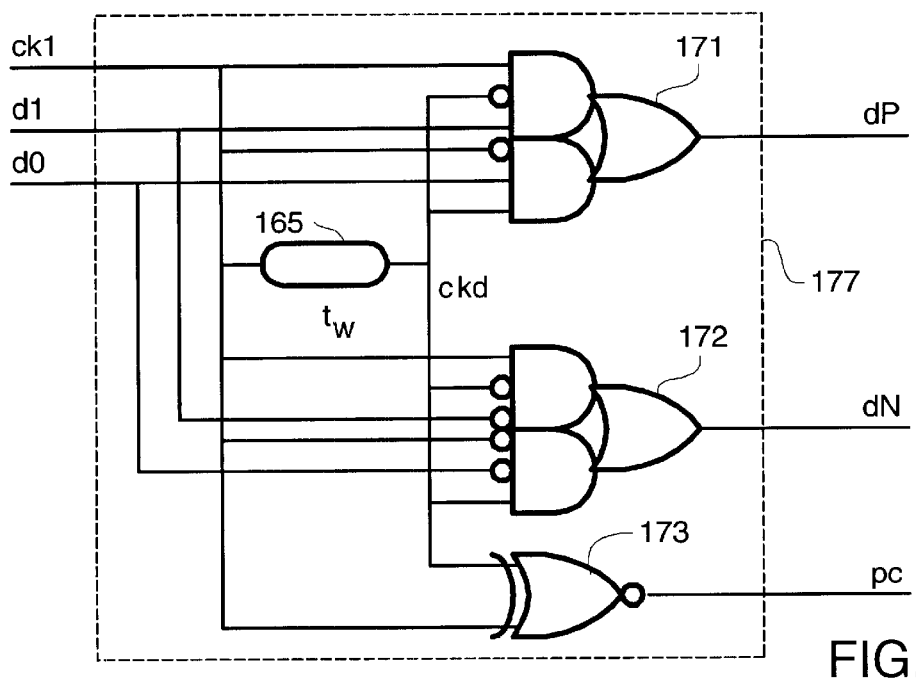
FIG. 12 illustrates a self-timing circuit for double data rate operation.
Figure 13:
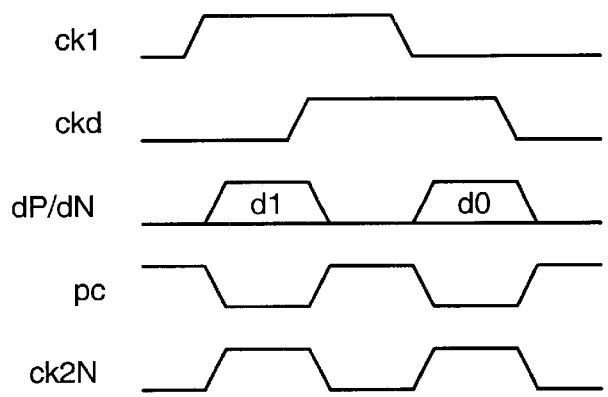
FIG. 13 illustrates waveforms of signals in the circuit of FIG. 12.
Figure 19:
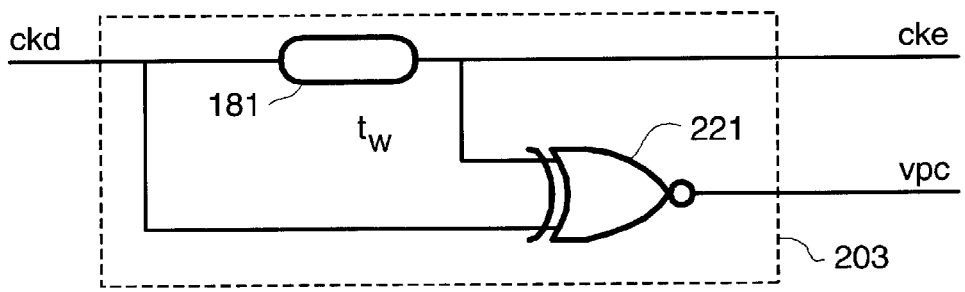
FIG. 19 illustrates details of the output timing circuit of FIG. 17.

The input timing circuit 177 has already been described with respect to FIG. 12. Details of output timing block 203 are shown in FIG. 19. Delayed clock ckd is further delayed by delay line 181 to generate clock cke. Delay line 181 has a delay tw that is matched to the time required for the modified repeater 217 to drive the vertical lines 195A through the sense voltage. This matching is achieved in the same manner as described above in reference to FIGS. 10 through 15. Clocks ckd and cke are combined by XNOR gate 221 to generate the vertical precharge signal vpc 199. This signal is asserted from the time cke toggles to the time ckd toggles in the opposite direction.

FIG. 20 shows the details of the entire crosspoint bitslice 197A including final decoder 201 and modified repeater 217. Decoder 201 comprises two CMOS transmission gates 235 and 236, an inverter 233, a buffer 237 and a 2-input dynamic NAND gate comprising transistors 225–228. When vertical precharge clock vpc 199 falls, it turns off transmission gates 235 and 236 latching address bits aXai and aXbj onto the gates of transistors 225 and 226 respectively. An inverter delay later, the output of inverter 233 goes high triggering the dynamic NAND gate 225–228. The output of the NAND gate goes low only if both aXai and aXbj were high at the point they were sampled by vpc falling. Each row Y is connected to one of the eight aXa lines and one of the nine aXb lines so that Y=8j+i. Thus, the coincidence of axai and aXbj indicates that the current row, Y is selected. The output of the NAND gate is buffered by buffer 237, a pair of inverters, to generate the crosspoint clock ckXYN 219. When the current row, Y, is selected, crosspoint clock 219 falls a short time after the falling edge of vpc 199. If the row is not selected, the crosspoint clock remains high.

Modified repeater 217 comprises receiver 119 and modified drive 223. This repeater is identical to the repeater 160 of FIGS. 8 and 9 except that the H-bridge driver 223 has no precharge device 117. When a crosspoint is selected and the crosspoint clock ckXYN 219 falls, the receiver amplifies the signal on differential input hYP/hYN and asserts one of its two outputs oP or oN high depending on the polarity of the input. The asserted output enables the H-bridge driver 223 to drive the vertical lines vXP/vXN in the proper direction. When vpc goes high, clock ckXYN goes high as well, predischarging receiver 119 via transistors 149 and 150. Discharging causes receiver outputs oP and oN to both go low disabling driver 223. When a crosspoint is not selected, ckXYN 219 remains high causing receiver outputs oP and oN to remain low which in turn disables driver 223 so some other crosspoint can drive the vertical lines without interference.

Figure 21:
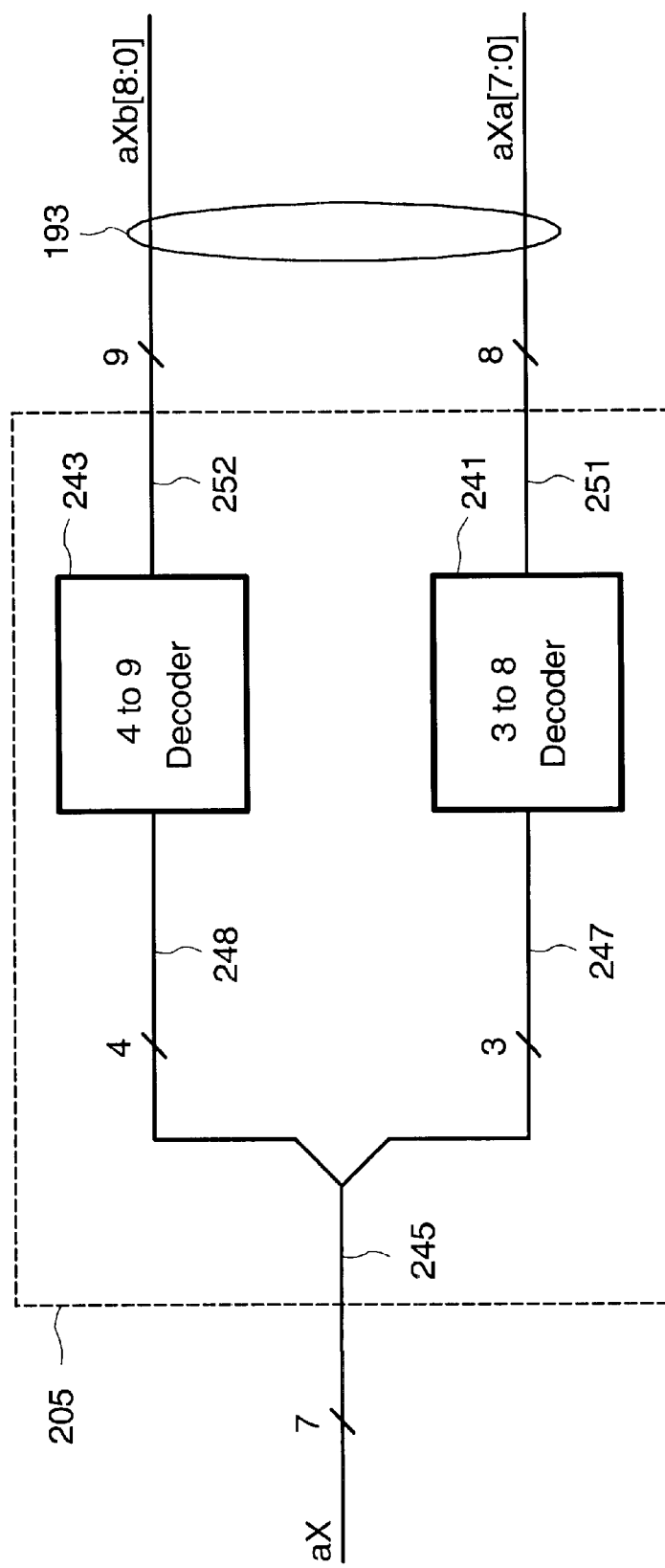
FIG. 21 illustrates the predecoder of FIG. 17.

FIG. 21 shows the details of predecoder 205. The seven-bit address ax 245 from multiplexer 211 which carries binary numbers in the range from 0 to 72 is split into a 3-bit field 247, the least significant bits, that is encoded in binary with a range from 0 to 7 and a four-bit field 248, the most significant bits, also binary with a range from 0 to 8. Three-bit binary address field 247 is fed to a 3 to 8 decoder 241 which decodes the eight input possibilities into an eight-bit one-hot encoding on signal aXa[7:0] 251. If field 247 contains the binary encoding of i, signal aXai will be true and all other bits of aXa will be false. Similarly, four-bit field 248 is decoded from binary to one-of-nine encoding by 4 to 9 decoder 243. The nine-bit one-hot encoding is output on signal aXb[8:0] 252. If field 248 contains the binary encoding of j, signal aXbj will be true and all other bits of aXb will be false. Collectively the nine bits of aXb[8:0] and eight bits of aXa[7:0] make up the seventeen bit pre-decoded address bus addrX 193. One skilled in the art will understand how decoders 241 and 243 can be constructed using static CMOS gates, dynamic CMOS gates, or pass-transistor logic.

One skilled in the art of decoder design will also understand that the seven input bits could be divided differently for predecoding, for example into 2, 2, and 3 bit fields rather than the 3 and 4 bit fields shown here. While the 2, 2, and 3 bit division results in fewer lines of predecoded address in bus addrX 193, only 13 rather than 17, it dissipates more power since three predecoded address lines may toggle each cycle rather than two.

Figure 22:
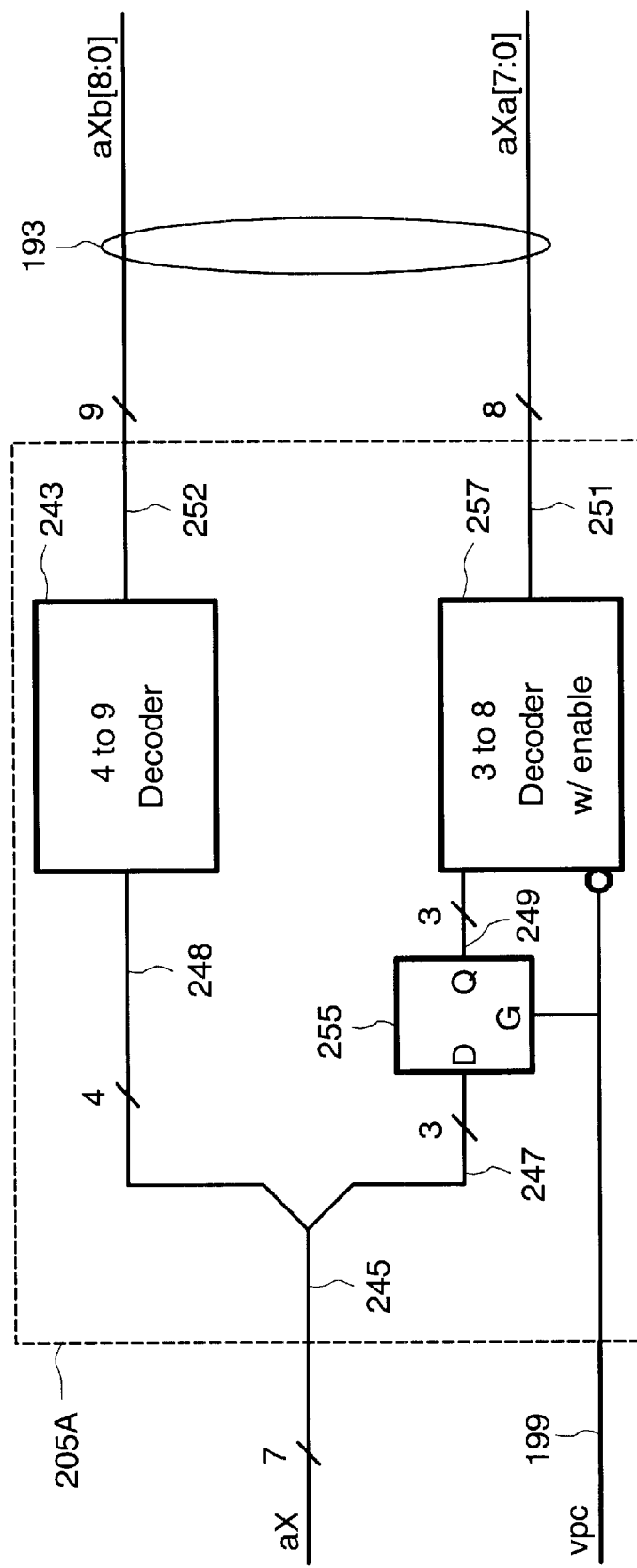
FIG. 22 illustrates an alternative predecoder for use in the circuit of FIG. 17.

An alternative form of predecoder 205, labeled 205A, that combines the vertical precharge clock 199 with the predecoded address bits aXa[7:0] 251 is illustrated in FIG. 22. This predecoder is used in conjunction with the modified final decoder 201A shown in FIG. 23. The predecoder 205A is identical to predecoder 205 shown in FIG. 21 except for two changes. First, the low-three bits 247 of address aX 245 are latched by three-bit transparent latch 255 to hold them valid after vpc 199 goes low and ckd switches multiplexer 211. Latch 255 essentially replaces the latch formed by CMOS transmission gate 235 in FIG. 20 by moving this latching function from after 3 to 8 decoder 257 to before the decoder. Second, a 3 to 8 decoder with a low-true enable 257 replaces the simple decoder 241 of FIG. 21. With this decoder, all eight bits of aXa[7:0] 251 are low whenever vpc 199 is high. When vpc 199 goes low, one bit, aXai, corresponding to the binary value i on decoder input 249, of 251 goes high while the remaining bits stay low. Thus signals aXa[7:0] 251 are qualified clocks that combine the timing of vpc 199 with the predecoding of the low three bits of the address 249.

Figure 23:
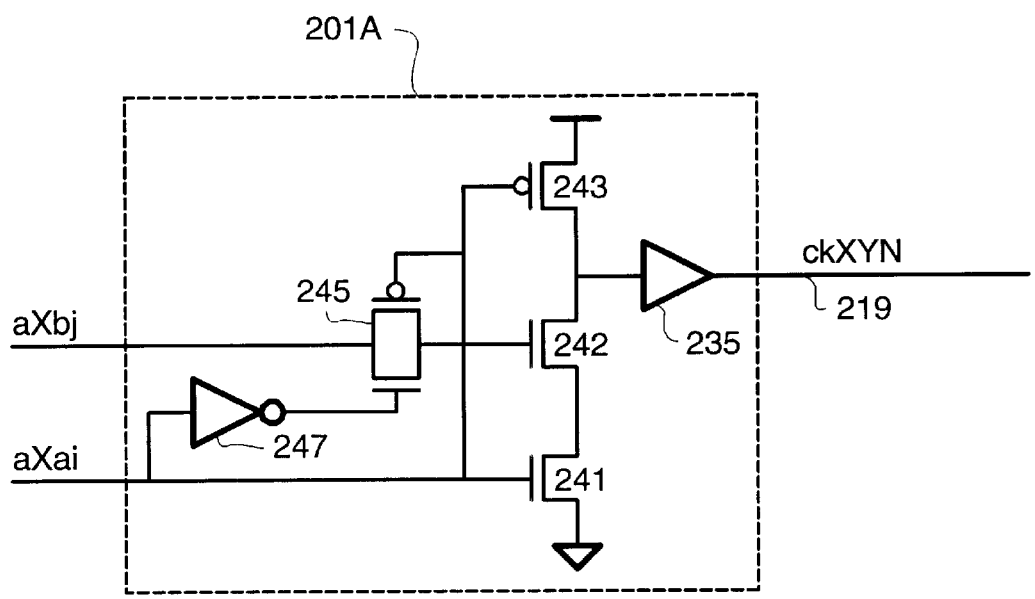
FIG. 23 illustrates an alternative decoder circuit for use in the circuit of FIG. 17.

The alternative predecoder 205A of FIG. 22 is used in conjunction with the modified final decoder 201A shown in FIG. 23. When the current crosspoint, XY, is selected, signal aXbj will be high and signal aXai will pulse high where the current row address Y=8j+i. The qualified clock aXai rises when vpc 199 falls and falls when vpc 199 rises. The rising edge of aXai latches the value of aXbj on the gate of transistor 242 via transmission gate 245. This rising edge also serves to trigger the dynamic NAND gate formed by transistors 241–243 to pull the crosspoint clock ckXYN 219 low via buffer 235. If the current crosspoint is not selected, either there will be no pulse on aXai, in which case the NAND gate is never triggered, or aXbj will be low, in which case the NAND gate evaluates to a high value and ckXNY 219 is not asserted. When aXai returns low in the all crosspoints, all of the dynamic NAND gates are precharged via device 243.

Figure 24:
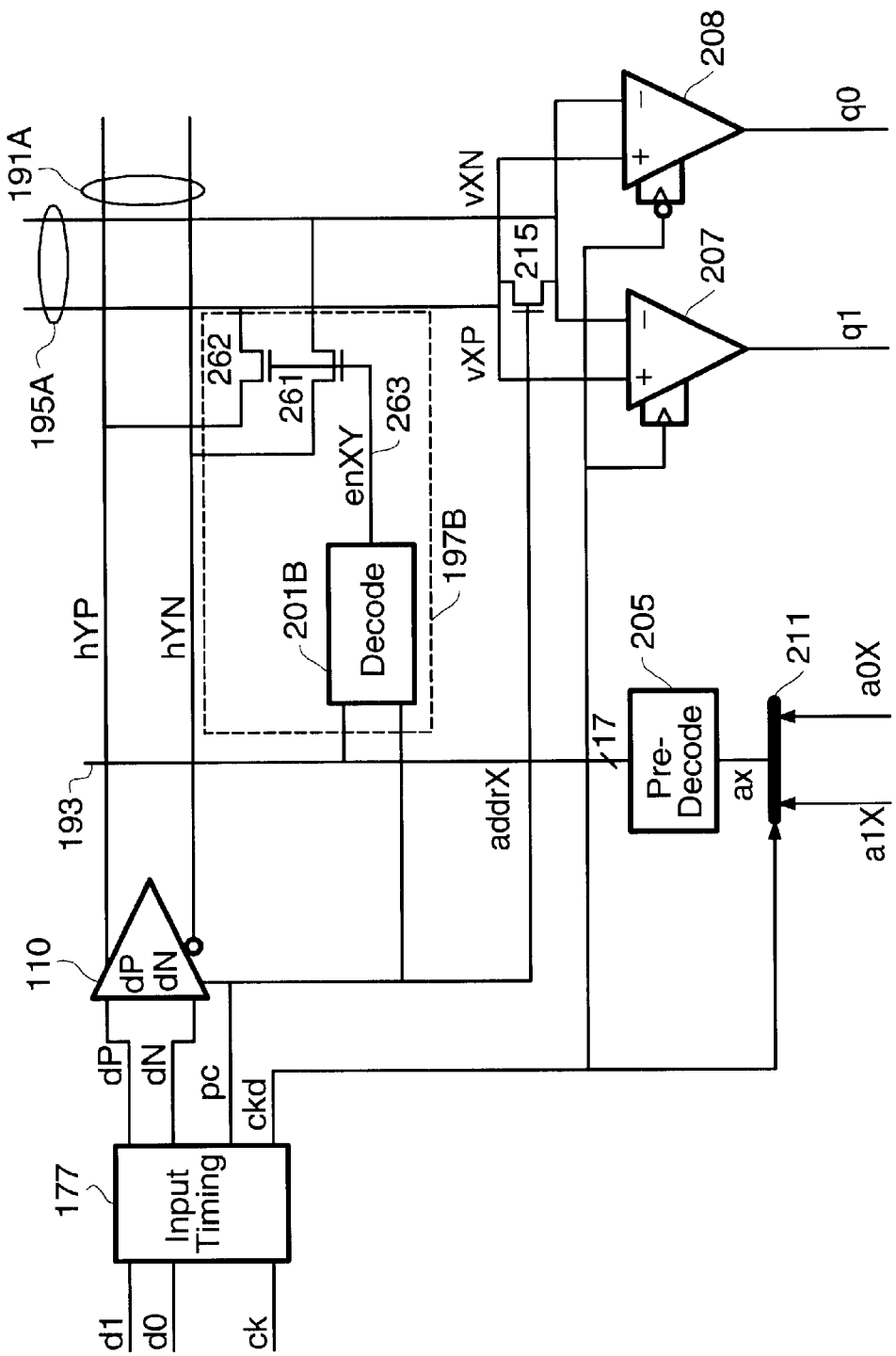
FIG. 24 illustrates an alternative embodiment of the crosspoint switch using a pass transistor crosspoint.
Figure 25:
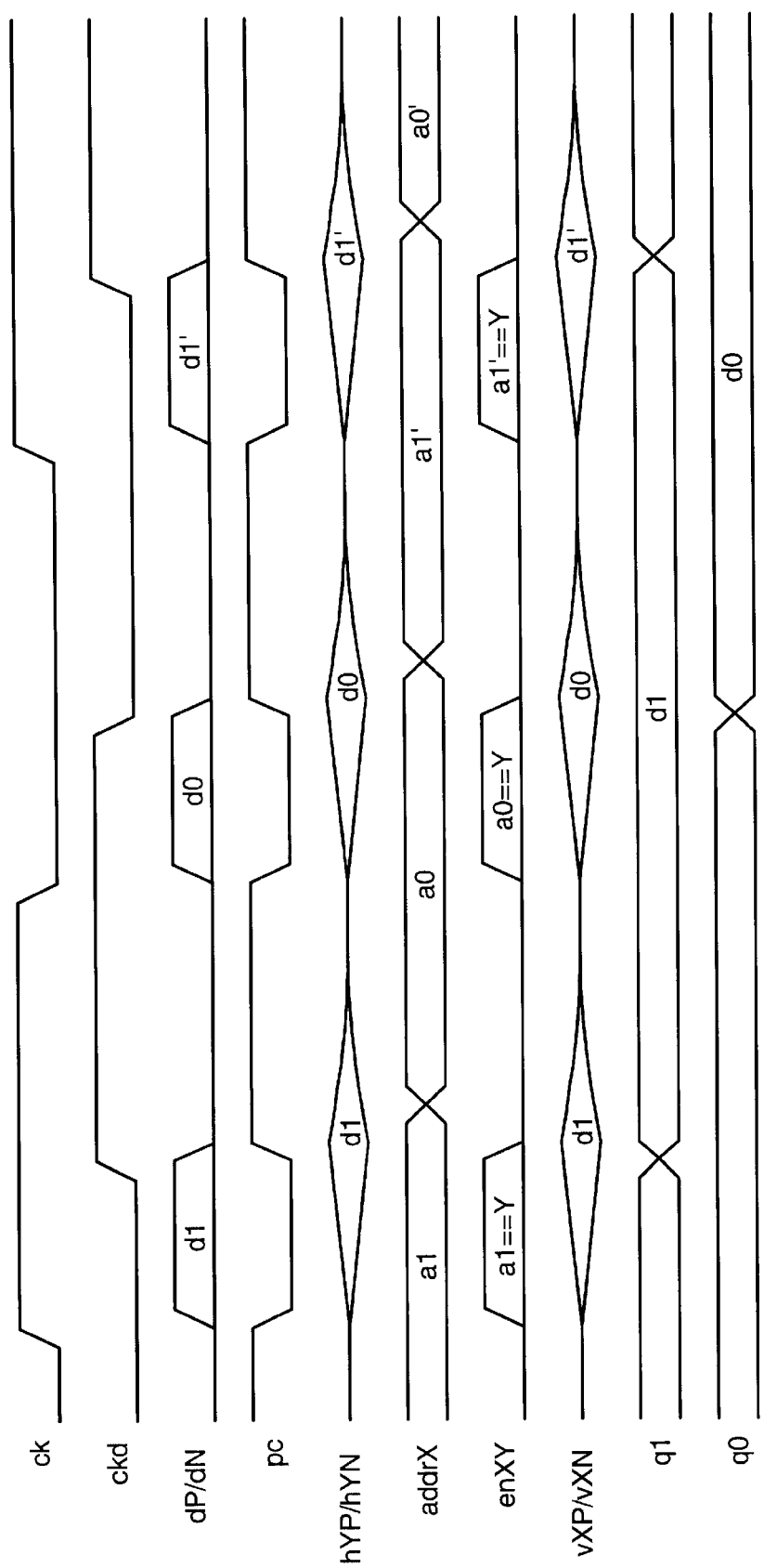
FIG. 25 illustrates waveforms of signals in the circuit of FIG. 24.

An alternative embodiment of the present invention that uses a passive pass-transistor crosspoint rather than a regenerative repeater crosspoint is illustrated in FIG. 24. Waveforms showing the operation of this embodiment are shown in FIG. 25. Each time ck toggles, the input timing circuit 177A deasserts precharge clock pc and asserts one of the drive signals dP or dN to drive the current bit onto the horizontal lines hYP/hYN 191A. At the same time, pc going low enables decoder 201B to decode the address encoded on lines addrX 193. If the address matches the current row, Y, then signal enXY 263 is asserted high. Decoder 201B differs from decoder 201 in that non-inverting buffer 235 in FIG. 20 or 23 is replaced by an inverting buffer to give a high true output. When enable signal enXY 263 is asserted, it enables NMOS pass-transistors 261 and 262 to pass the signal from the horizontal lines 191A to the vertical lines 195A.

When the vertical lines have been driven through the sense voltage, the input timing circuit 177A deasserts the drive signals dP and dN, asserts the precharge signal, pc, and toggles delayed clock ckd. Clock ckd samples the value on the vertical lines into one of the receive amplifiers 207 or 208 and selects the next address via multiplexer 211. Asserting the pc signal precharges both the horizontal lines, via driver 110, and the vertical lines, via shorting transistor 215.

The input timing circuit 177A differs from input timing circuit 177 in FIGS. 12 and 17 only in that delay line 165 has its delay $t_w$ set to match the combined delay across the horizontal lines 191A, pass gates 261 and 262, and vertical lines 195A instead of just the delay of the horizontal lines as in FIG. 17. Thus clock ckd is asserted when the sense voltage is developed across the vertical lines.

A disadvantage of the pass-transistor crosspoint of FIG. 24, relative to the amplifier crosspoints of FIG. 17, is that the pass-transistor crosspoint provides no gain and hence is unable to support fan-out of the low swing signals from a single horizontal line to multiple vertical lines. Such fanout is required for multicast or broadcast operation.

Yet another alternative embodiment of the present invention employs static (unclocked) amplifiers at each crosspoint and at the outputs to enable the crosspoint switch to be operated without a clock. To save power, only the amplifiers at selected crosspoints are powered up. Amplifiers at unselected crosspoints are unpowered which leaves their outputs in a high-impedance state. In the preferred form of this embodiment, each crosspoint consists of an amplifier, a pulse generator, and an H-bridge driver. When the crosspoint is selected, the amplifier amplifies the low swing signal on the horizontal lines to full swing. The pulse generator detects transitions on the amplified signal and generates pulses to drive the H-bridge driver using a self-timed circuit of the form shown in FIG. 12. The H-bridge driver then drives the vertical line to the proper level.

One skilled in the art of digital circuit design will understand that several variations of the design described above are possible. For example, the crossbar circuits of FIGS. 17 and 24 can be modified to operate on only a single edge of the clock rather than on both edges by using the circuit techniques described in conjunction with FIGS. 10 and 14. The crossbar circuits could also be realized with the prior driver arrangement shown in FIG. 1 rather than the driver of FIG. 3. The crossbar switch can be realized with a different number of input and output ports and the number of inputs and outputs need not be the same. Also, the width of each port could be varied and the clock rate of the crossbar could be varied. Further the entire crossbar need not be run in a single timing domain, but rather each input can run in its own clock domain passing timing information through the crosspoint to the receiver.

While this invention has been particularly shown and described with references to preferred embodiments thereof, it will be understood by those skilled in the art that various changes in form and details may be made therein without departing from the scope of the invention encompassed by the appended claims.

What is claimed is:

1. A data link on an integrated circuit comprising:

a clock;

a push-pull driver circuit, clocked from the clock, driving a pair of differential data lines, one line driven high while the other line is pulled low; and a receiver including a sense amplifier clocked from the clock.

2. A data link as claimed in claim 1 wherein each of the differential lines is driven through a low swing.

3. A data link as claimed in claim 2 wherein the driver circuit comprises a data-line-to-data-line precharge circuit that shares charge between the data lines to a midpoint of voltage swing on the data lines.

4. A data link as claimed in claim 2 wherein the push-pull driver circuit is clocked through a timing circuit including a delay, the timing of which varies in a manner similar to timing variations in the driver circuit.

5. A data link as claimed in claim 1 wherein the driver circuit comprises a data-line-to-data-line precharge circuit that shares charge between the data lines to a midpoint of voltage swing on the data lines.

6. A data link as claimed in claim 1 wherein the driver circuit is an H-bridge, one line being driven high by a leg of the H as the other line is pulled low by a diagonal leg of the bridge.

7. A data link as claimed in claim 6 wherein the H-bridge comprises an NMOS transistor in each leg of the bridge.

8. A data link as claimed in claim 1 wherein the sense amplifier is isolated from the data lines by pass gates.

9. A data link as claimed in claim 1 wherein the data lines are connected only to gate terminals of input transistors of the sense amplifier.

10. A data link as claimed in claim 1 further comprising a regenerative repeater between the driver and sense amplifier, the repeater being clocked from the clock.

11. A data link as claimed in claim 1 wherein the drive circuit and receiver are formed of MOSFETs.

12. An on-chip transmission system comprising:
a clock;
a push-pull driver circuit, clocked from the clock, driving a signal on a pair of differential data lines, one line driven high while the other line is pulled low;
a regenerative repeater clocked from the clock to regenerate the signal from the driver circuit; and
a receiver including a sense amplifier which senses the signal regenerated by the repeater.

13. A transmission system as claimed in claim 12 wherein the driver circuit comprises a data-line-to-data-line precharge circuit that shares charge between the data lines to a midpoint of voltage swing on the data lines.

14. A transmission system as claimed in claim 12 wherein the driver circuit is an H-bridge, one line being driven high by a leg of the H as the other line is pulled low by a diagonal leg of the bridge.

15. A transmission system as claimed in claim 12 wherein the clock provides a plurality of clock signals having different phases.

16. A transmission system as claimed in claim 12 wherein the repeater comprises a sense amplifier, the output of which enables a driver circuit of the repeater.

17. A transmission system as claimed in claim 12 wherein the sense amplifier is isolated from the data lines by pass gates.

18. A transmission system as claimed in claim 12 wherein the data lines are connected only to gate terminals of input transistors of the sense amplifier.

19. A transmission system as claimed in claim 12 wherein the driver circuit and receiver are formed of MOSFETs.

20. A transmission system as claimed in claim 12 wherein each of the differential lines is driven through a low swing.

21. A transmission system as claimed in claim 20 wherein the push-pull driver circuit is clocked through a timing circuit including a delay, the timing of which varies in a manner similar to timing variations in the driver circuit.

22. A regenerative repeater circuit comprising:
a clocked sense amplifier clocked from a clock; and
a driver circuit clocked from the clock enabled by the sense amplifier, the driver circuit being a push-pull driver circuit driving a pair of differential lines, one line driven high while the other line is pulled low.

23. The repeater circuit as claimed in claim 22 wherein the driver circuit comprises a data-line-to-data-line precharge circuit that shares charge between the data lines to a midpoint of voltage swing on the data lines.

24. A repeater circuit as claimed in claim 22 wherein the driver circuit is an H-bridge, one line being driven high by a leg of the H as the other line is pulled low by a diagonal leg of the bridge.

25. A repeater circuit as claimed in claim 22 wherein the sense amplifier is gate isolated.

26. A repeater circuit as claimed in claim 22 formed of MOSFETs.

27. A repeater circuit as claimed in claim 22 wherein each line is driven through a low swing.

28. A repeater circuit as claimed in claim 27 wherein the push-pull driver circuit is clocked through a timing circuit including a delay, the timing of which varies in a manner similar to timing variations in the driver circuit.

29. A digital driver circuit comprising:
a push-pull driver driving a pair of differential data output lines, one line driven high while the other line is pulled low; and
a data-line-to-data-line precharge circuit that shares charge between the data lines to a midpoint of voltage swing on the data lines.

30. A digital driver circuit as claimed in claim 29 wherein the driver circuit is an H-bridge, one line being driven high by a leg of the H as the other line is pulled low by a diagonal leg of the bridge.

31. A digital driver circuit as claimed in claim 30 wherein the H-bridge comprises an NMOS transistor in each leg of the bridge.

32. A digital driver circuit as claimed in claim 29 formed of MOSFETs.

33. A digital driver circuit as claimed in claim 29 wherein each line is driven through a low swing.

34. A driver circuit as claimed in claim 33 wherein the push-pull driver circuit is clocked through a timing circuit including a delay, the timing of which varies in a manner similar to timing variations in the driver circuit.

35. A digital driver circuit comprising:
a push-pull driver driving a pair of differential output lines, one line driven high while the other line is pulled low; and
a timing circuit which controls timing of the push-pull driver, the timer circuit including a delay, the timing of which varies in a manner similar to timing variations in the driver circuit.

36. A method of transmitting data in an integrated circuit comprising:
at a push-pull driver circuit clocked from a clock, driving a pair of differential data lines, one line driven high while the other line is pulled low; and
at a receiver, sensing the signal on the differential data lines with a sense amplifier clocked from the clock.

37. A method as claimed in claim 36 wherein each of the differential lines is driven through a low swing.

38. A method as claimed in claim 37 further comprising precharging the differential lines through a data-line-to-data-line precharge circuit in the driver circuit that shares charge between the data lines to a midpoint of voltage swing on the data lines.

39. A method as claimed in claim 37 further comprising timing the push-pull driver circuit with a delay, the timing of which varies in a manner similar to timing variations in the driver circuit.

40. A method as claimed in claim 36 further comprising precharging the differential lines through a data-line-to-data-line precharge circuit in the driver circuit that shares charge between the data lines to a midpoint of voltage swing on the data lines.

41. A method as claimed in claim 36 further comprising regenerating the signal from the push-pull driver circuit in a repeater between the driver and the receiver, the repeater being clocked from the clock.

42. A method of transmitting data in a chip comprising:
at a push-pull driver circuit clocked from a clock, driving a signal on a pair of differential lines, one line driven high while the other line is pulled low;
regenerating the signal from the driver circuit in a repeater clocked from the clock; and
sensing the signal from the repeater in a receiver.

43. A method as claimed in claim 42 further comprising precharging the differential lines through a data-line-to-data-line precharge circuit in the driver circuit that shares charge between the data lines to a midpoint of voltage swing on the data lines.

44. A method as claimed in claim 42 wherein the clock is a multiphase clock.

45. A method as claimed in claim 42 wherein each of the differential lines is driven through a low swing.

46. A method as claimed in claim 45 further comprising timing the push-pull driver circuit with a delay, the timing of which varies in a manner similar to timing variations in the driver circuit.

47. A method of repeating a data signal comprising:

sensing the data signal in a clocked sense amplifier clocked from a clock; and from the output of the sense amplifier enabling a driver circuit clocked from a clock which repeats the signal received at the sense amplifier, the driver circuit being a push-pull driver circuit driving a pair of differential lines, one line driven high while the other line is pulled low.

48. A method as claimed in claim 47 further comprising precharging the differential lines through a data-line-to-data-line precharge circuit in the driver circuit that shares charge between the data lines to a midpoint of voltage swing on the data lines.

49. A method as claimed in claim 47 wherein each of the differential lines is driven through a low swing.

50. A method as claimed in claim 49 further comprising timing the push-pull driver circuit with a delay wherein the push-pull driver circuit is clocked through a timing circuit including a delay the timing of which varies in a manner similar to timing variations in the driver circuit.

51. A method of driving a digital signal comprising:

precharging a pair of differential output lines by sharing charge between the two lines to a midpoint of voltage swing on the output lines; and driving the differential output lines, one line driven high while the other line is pulled low.

52. A method as claimed in claim 51 wherein each of the differential lines is driven through a low swing.

53. A method as claimed in claim 52 further comprising timing the push-pull driver circuit with a delay, the timing of which varies in a manner similar to timing variations in the driver circuit.

54. A method of driving a digital signal comprising:

driving a pair of differential output lines through a push-pull driver, one line driven high while the other line is pulled low; and from a clock signal, timing the push-pull driver circuit with a delay, the timing of which varies in a manner similar to timing variation in the driver circuit.

55. A data link on an integrated circuit comprising:

a clock;

driver means, clocked from the clock, for driving a pair of differential lines, one line driven high while the other line is pulled low; and receiver means including a sense amplifier clocked from the clock.

56. An on-chip transmission system comprising:

a clock;

driver means, clocked from the clock, for driving a signal on a pair of differential lines, one line driven high while the other line is pulled low;

regenerative repeater means clocked from the clock for regenerating the signal from the driver circuit; and receiver means for sensing the regenerated signal.

57. A regenerative repeater circuit comprising:

clocked sense amplifier means clocked from a clock for sensing a received signal; and driver means clocked from the clock enabled by the sense amplifier means for driving the sensed signal on an output line.

58. A digital driver circuit comprising:

driver means for driving a pair of differential output lines, one line driven high while the other line is pulled low; and precharge means for precharging the differential output lines by sharing charge between the lines to a midpoint of voltage swing on the differential output lines.

59. A digital driver circuit comprising:

push-pull driver means for driving a pair of differential output lines, one line driven high while the other line is pulled low; and timing circuit means for controlling timing of the push-pull driver, the timing circuit means including a delay, the timing of which varies in a manner similar to timing variations in the driver circuit.

60. A data link in an integrated circuit comprising:

a clock;

a push-pull driver circuit driving a pair of differential lines through a low swing, one line driven high while the other line is pulled low;

a line-to-line precharge circuit which precharges the differential lines to a common voltage; by sharing charge between the differential lines to a midpoint of voltage swing on the differential lines;

a timing circuit which clocks the push-pull driver circuit from the clock, the timing circuit including a delay, the timing of which varies in a manner similar to timing variations in the driver circuit;

a regenerative repeater clocked from the clock to regenerate the signal from the driver circuit; and a receiver including a sense amplifier, clocked from the clock, to sense the regenerated signal from the repeater.

* * * * *